United States Patent [19]
Nakahara

[11] Patent Number: 4,916,504
[45] Date of Patent: Apr. 10, 1990

[54] THREE-DIMENSIONAL CMOS INVERTER

[75] Inventor: Moriya Nakahara, Kawasaki, Japan

[73] Assignee: Kabushiki Kaisha Toshiba, Kawasaki, Japan

[21] Appl. No.: 907,163

[22] Filed: Sep. 15, 1986

Related U.S. Application Data

[63] Continuation of Ser. No. 662,085, Oct. 18, 1984, abandoned.

[30] Foreign Application Priority Data

Oct. 24, 1983 [JP] Japan .................................. 58-198688

[51] Int. Cl.[4] ..................... H01L 27/12; H01L 29/78; H01L 27/02; H01L 29/04
[52] U.S. Cl. .......................................... 357/42; 357/4; 357/23.1; 357/23.7; 357/59
[58] Field of Search ....................: ...... 357/4, 23.7, 23.14, 357/42, 59, 23.1

[56] References Cited

U.S. PATENT DOCUMENTS 4,570,175  2/1986  Miyao et al. ........................... 357/42

FOREIGN PATENT DOCUMENTS 56-94670  7/1981  Japan ..................................... 357/42
58-87859  5/1983  Japan ..................................... 357/42

OTHER PUBLICATIONS

C. Cohen, "3–d IC May Auger Denser VLSI Circuitry; Multiple Layers are a Possibility", *Electronics*, (Sep. 22, 1983), p. 92.
J. F. Gibbons et al., "One-Gate Wide CMOS Inverter on Laser-Recrystallized Polysilicon," *IEEE Electron Device Letters*, vol. EDL-1, No. 6, pp. 117–118, Jun. 1980.
N. Sasaki et al., "3-Dimensional IC's Fabricated by Using Ar+ Laser Recrystallication", The 15h Conference on Solid State Devices and Materials, (Aug. 30–Sep. 1, 1983), Tokyo.

*Primary Examiner*—J. Carroll
*Attorney, Agent, or Firm*—Finnegan, Henderson, Farabow, Garrett & Dunner

[57] ABSTRACT

A semiconductor device comprises a semiconductor substrate of first conductivity type with a major surface having an element isolation region formed on it. It further comprises island regions formed in the major surface region of said substrate and electrically isolated by said element isolation region, source and drain regions of second conductivity type formed in at least one of said island regions and electrically isolated from each other, thereby defining a channel region between them, a first gate insulating film formed on that surface portion of said island region in which at least said channel region is formed, a first gate electrode formed on said gate insulating film, a second gate insulating film formed on said gate electrode, an active layer made of recrystallized polysilicon, formed on said second gate insulating film, and consisting of source and drain regions of the first conductivity type and a channel region of the second conductivity type sandwiched between the source and drain regions, a third gate insulating film formed on that surface portion of said active layer in which at least the channel region is formed, and a second gate electrode formed on said third gate insulating film and connected to said first gate electrode.

1 Claim, 7 Drawing Sheets

F I G. 3A
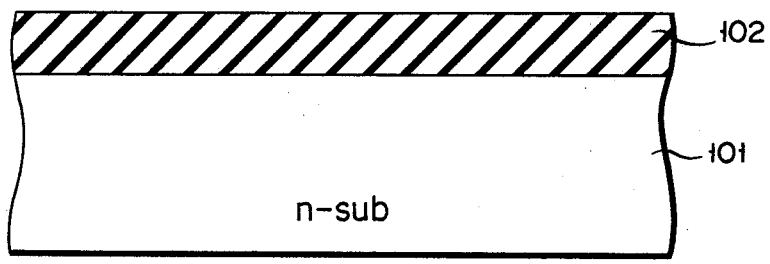
F I G. 3B
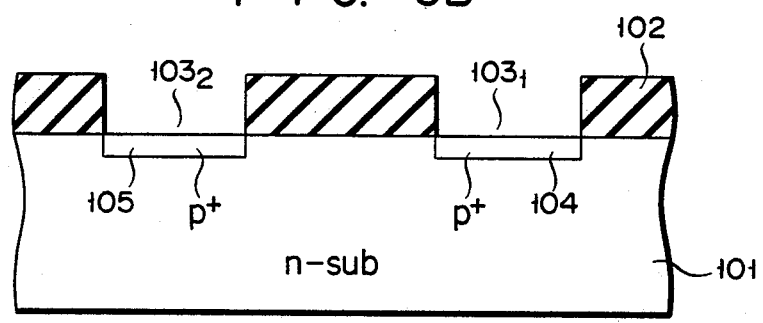
F I G. 3C
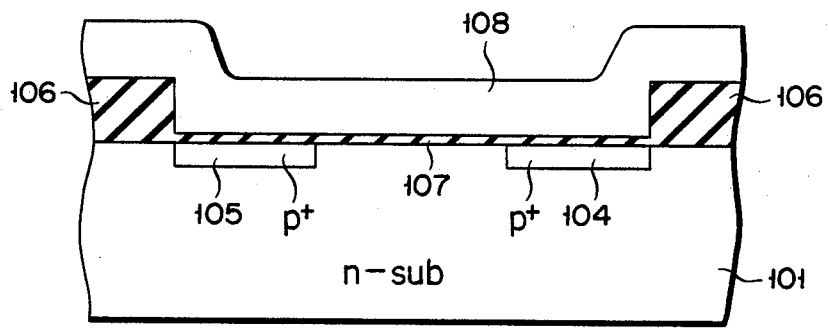

THREE-DIMENSIONAL CMOS INVERTER

This application is a continuation of application Ser. No. 662,085, filed Oct. 18, 1984, now abandoned.

BACKGROUND OF THE INVENTION

The present invention relates to a semiconductor device, and more particularly to a semiconductor device with a three-dimensional complementary metal oxide semiconductor inverter.

The three-dimensional complementary metal oxide semiconductor (3-D-CMOS) inverter is discussed in J. F. Gibbons, *One-Gate-Wide CMOS Inverter on Laser-Recrystallized Polysilicon.* This 3-D-CMOS inverter will briefly be described referring to FIG. 1.

As shown in FIG. 1, a field oxide film 2 is formed on a substrate 1. P+ type drain and source regions 3 and 4, are formed in each of the island regions (i.e., element regions) of the substrate 1, which are electrically isolated by the field oxide film 2. The drain and source regions 3 and 4 are also electrically isolated. A first gate oxide film 5 is formed on the island region which includes a channel region between the source region 3 and drain region 4. A gate electrode 6 is formed on the first gate oxide film 5. It is made of polysilicon and has a thickness of, for example, 1 μm. It is used as the parts of both a p-channel and an n-channel MOS transistors. A second gate oxide film 7 is formed on the gate electrode 6. An active layer 8 is formed on the oxide film 7. It consists of an n+ type source region 9, an n+ type drain region 10, and a p type channel region 8′ sandwiched between the n+ type regions 9 and 10. The active layer 8 is formed in the following manner. First, polysilicon is deposited on the entire surface of the unfinished product, thus forming a polysilicon film. Ions of p-type impurity are implanted into the polysilicon film. This film is irradiated with an Argon laser beam is applied from a scanning type continuous wave (cw) argon laser to this film, thereby recrystallizing the film. Then, the recrystallized film is patterned, thus forming a p type layer. Finally, ions of n type impurity are implanted into the end portions of this p type layer, thus forming the active layer 8.

The field film 2, p+ type region 3, 4, oxide film 7 and the active layer 8 are covered by an insulation film 11. The insulation film 11 has contact holes 12. Al wiring strips 13, 14 and 15 are formed on the insulation film 11. The strip 13 is connected through the contact hole 12 to the p+ type source region 3. The strip 14 is connected through the contact 12 to the n+ type source region 9. The strip 15 is connected through two contact holes 12 to the p+ type drain region 4 and n+ type drain region 10.

FIG. 2 is the equivalent circuit diagram of the 3-D-CMOS inverter described above. This circuit comprises a p-channel MOS transistor Tr1 and a n-channel MOS transistor Tr2. The transistor Tr1 is made of the source region 3 and the drain region 4, the oxide film 5 and the gate electrode 6. The transistor Tr2 is made of the n+ type regions 9 and 10, oxide film 7 and gate electrode 6. The gate electrode 6 is connected to a Vin terminal. The Al wiring strip 13 is connected to a terminal $V_{DD}$, and the Al wiring strip 14 to $V_{SS}$. The Al wiring strip 15 is connected to a terminal Vout.

As mentioned above, the conventional 3-D-CMOS inverter shown in FIG. 1 has an active layer 8 which consists of an n+ type source region 9, an n+ type drain region 10, and a p type channel region 8′ sandwiched between the n+ type regions 9 and 10. The active layer 8 is formed, as mentioned above, by depositing polysilicon on the entire surface of the unfinished product, thus forming a polysilicon film, by implanting ions of p-type impurity into the polysilicon film, by irradiating this film with A laser beam applied from a scanning type continuous wave (cw) argon laser, thereby recrystallizing the film, by patterning the recrystallized film, thus forming a p type layer, and by implanting ions of n type impurity into the end portions of this p type layer. The active layer 8 thus formed is not a perfectly single crystal layer: it is rather a polysilicon layer. The effective mobility of the n-channel MOS transistor Tr2 having this layer 8 is smaller than that of the n-channel MOS transistor formed on the single crystalline silicon substrate. In this respect, the 3-D-CMOS inverter of FIG. 1 operates but at a low speed.

To increase the operating speed of the inverter, the channel of the inverter has been broadened by increasing the area of the active layer 8. This method, however, induces another problem that the larger the layer 8, the more bulky the 3-D-CMOS inverter. The packing density of a semiconductor device using the 3-D-CMOS inverters is inevitably low.

SUMMARY OF THE INVENTION

Accordingly, the object of the present invention is to provide a semiconductor device having a 3-D-CMOS inverter which operates at a high speed and is yet small, not deteriorating the packing density of the semiconductor device.

According to the present invention, there is provided a semiconductor device comprising a semiconductor substrate of first conductivity type with a major surface having an element isolation region provided therein, island regions provided in the major surface, the island regions being isolated from each other by the element isolation region, second conductivity type source and drain regions provided in at least one of the island regions, while the source and drain regions being electrically isolated from each other, and the source and drain regions providing a channel region, a first gate insulating film provided on the surface of each of the island regions including at least the channel region, a first gate electrode provided on the gate insulating film, a second gate insulating film provided on the gate electrode, an active layer of recrystallized polysilicon formed on the second gate insulating film and consisting of source and drain regions of the first conductivity type and a channel region of the second conductivity type sandwiched between the source and drain regions, a third gate insulating film provided on the surface of the active layer including at least the channel region, and a second gate electrode formed on the third gate insulating film, and interconnected with the first gate electrode.

BRIEF DESCRIPTION OF THE DRAWINGS

FIGS. 3A–3I are cross sectional views illustrating how the 3-D-CMOS inverter used in a semiconductor device of the present invention is manufactured;

DETAILED DESCRIPTION OF THE PREFERRED EMBODIMENTS

Figure 1:
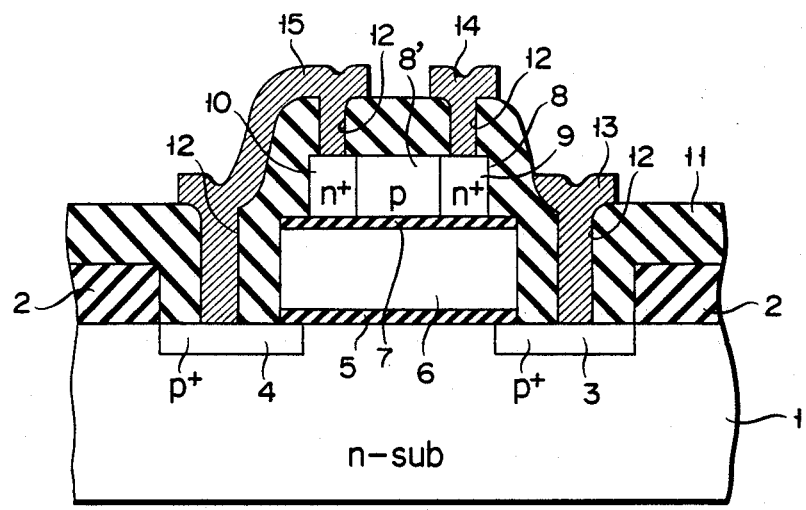
FIG. 1 is a cross sectional view of a conventional 3-D-CMOS inverter.
Figure 2:
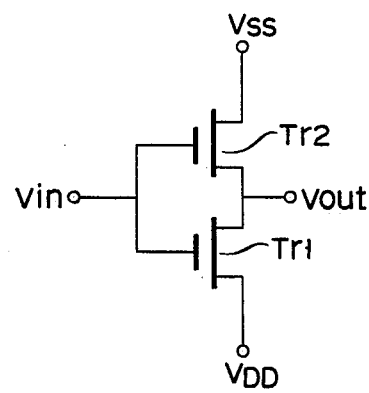
FIG. 2 shows the equivalent circuit of the CMOS inverter of FIG. 1.

It will be described in detail how an embodiment of the present invention is made with reference to FIGS. 3A-3I.

As shown in FIG. 3A, an oxide film 102 having a thickness of 5000 Å is formed on the surface of an n type single crystal silicon substrate 101 by the thermal oxidation process. Then, the oxide film 102 is selectively etched, thus forming openings $103_1$ and $103_2$. In this etching process, a resist pattern (not shown) formed by a photo engraving process (PEP) is used as a mask. Those portions of the substrate 101 where source and drain regions will be formed are exposed through these openings $103_1$ and $103_2$, as shown in FIG. 3B. The resist pattern is removed. Using the oxide film 102 as a mask, ions of p type impurity, e.g., boron, are implanted into the substrate 101 at the dose of $2 \times 10^{15} cm^{-2}$ by applying acceleration voltage of 40 KeV. The p type impurity is then activated, thereby forming a p+ type source region 104 and a p+ type drain region 105 in the surface region of the substrate 101.

Thereafter, as shown in FIG. 3C, the oxide film 102 left on that portion of the substrate 101 which is located between the regions 104 and 105 is removed, whereby the oxide film 102 is patterned into a field oxide film 106 (i.e., an element isolation region). Then, the unfinished product is thermally oxidized in an oxygen atmosphere at 1000° C., thereby forming an oxide film 107 having a thickness of 500 Å on each of the island regions of the substrate 101 which are electrically isolated by the field oxide film 106. Then, a polysilicon layer 108 having a thickness of 5000 Å is formed on the entire surface of the unfinished product by the chemical vapor deposition (CVD) method. Then, the layer 108 is subjected to a $POCl_3$ diffusion at 1000° C. for 20 minutes, thereby forming a phosphorous doped polysilicon layer 108.

Figure 3D:
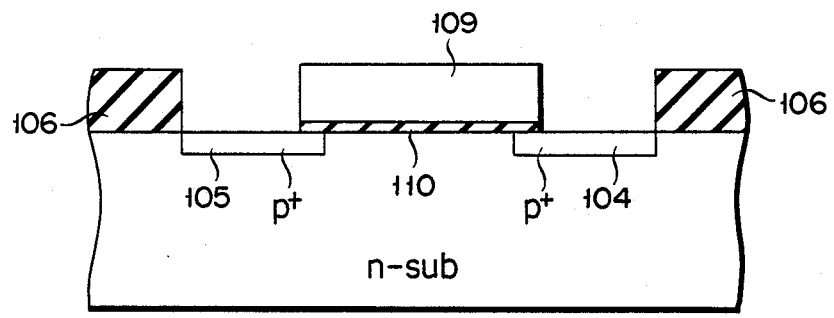

Thereafter, as shown in FIG. 3D, a resist pattern (not shown) is formed by the PEP on the phosphorous doped polysilicon layer 108. Using this resist pattern as a mask, the layer 108 is selectively etched, forming a first gate electrode 109. The resist pattern is removed, and the oxide film 107 is selectively etched, by using the first gate electrode 109 as a mask, thus forming a first gate oxide film 110.

Figure 3E:
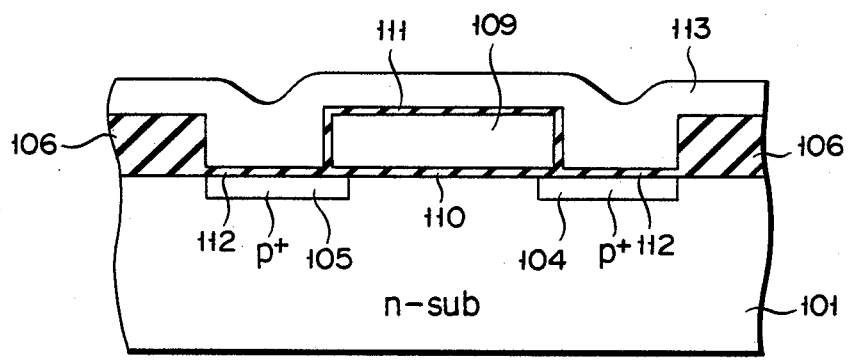
Figure 3F:
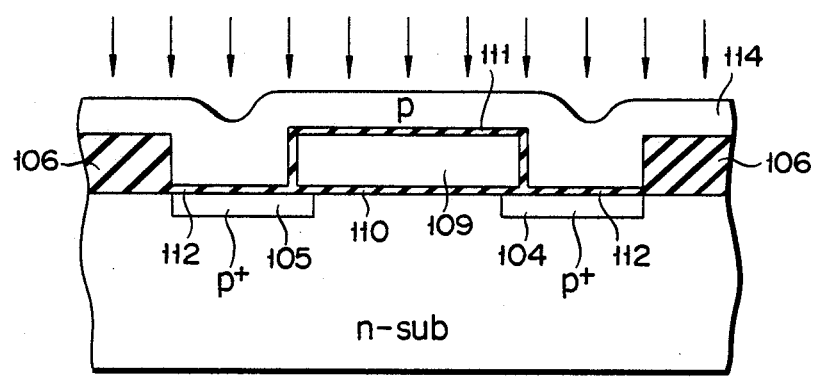

The unfinished product is then thermally oxidized in a dry oxygen atmosphere at 1000° C. As shown in FIG. 3E, a second gate oxide film 111 having a thickness of 500 Å is formed, covering the top surface and sides of the first gate electrode 109. At the same time, an oxide film 112 having a thickness of 300 Å is formed on the surface of the exposed portions of the island region of the substrate 101. A polysilicon layer 113 having a thickness of 3000 Å is then formed on the entire surface of the unfinished product by the CVD method. Further, as shown in FIG. 3F, ions of p type impurity, e.g., boron, are implanted into the layer 113 at the dose of $1 \times 10^{12} cm^{-2}$ by applying an acceleration voltage of 100 KeV. The polysilicon layer 113 is irradiated with a laser beam (a spot size: 40 μm) emitted by a scanning type CW argon laser whose output 10 W, while maintaining the substrate 101 at 350° C. The layer is then made into a p type recrystallized polysilicon layer 114.

Figure 3G:
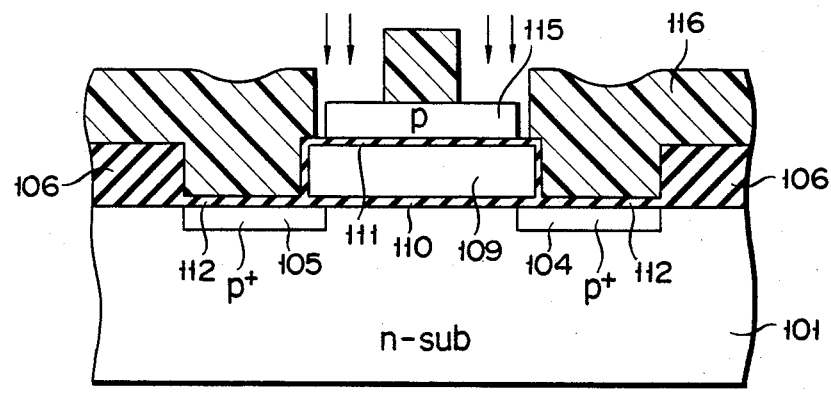
Figure 3H:
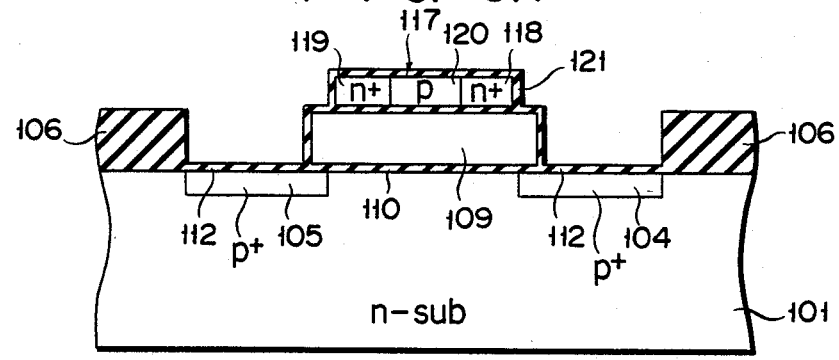

Further, as illustrated in FIG. 3G, the layer 114 is patterned, forming a p type recrystallized polysilicon pattern 115 on the second gate oxide film 111. A resist pattern 116 is formed on the surface of the unfinished product by the PEP method. Using the resist pattern 116 as a mask, ions of n type impurity, e.g. phosphorus, are implanted into the pattern 115 at the dose of $2 \times 10^{15} cm^{-2}$ with an acceleration voltage of 120 KeV. Then, the resist pattern 116 is removed. The entire unfinished product is thermally oxidized in a dry oxygen atmosphere at 1000° C. During the thermal oxidation, the phosphorous in the p type polysilicon layer 115 is activated, thus forming an active layer 117 consisting of an n+ type source region 118, an n+ type drain region 119 and a p type channel region 120 sandwiched between the regions 118 and 119 as shown in FIG. 3H. At the same time, a third gate oxide film 121 is formed on the top surface and sides of the active layer 117.

Thereafter, the second gate oxide film 111 is selectively etched to form a contact hole 122. A polysilicon layer is deposited on the entire surface of the unfinished product by the CVD method. This polysilicon layer is injected to $POCl_3$ diffusion and made into a phosphorous doped polysilicon layer. The polysilicon layer is patterned, thus forming a second gate electrode 123 on the third gate oxide film 121 formed on the p type active layer 117. This electrode 123 is connected through the contact hole 122 to the first gate electrode 109. An $SiO_2$ film 124 is formed on the entire surface of the unfinished product. Then, the $SiO_2$ film 124, first gate oxide film 110 and third gate oxide film 121 are selectively etched to have four contact holes 125, thereby exposing the p+ type source region 104, p+ type drain region 105, the n+ type source region 118 and n+ type drain region 119. An Al film is formed on the entire surface of the unfinished product by the vacuum vapor deposition. It is then patterned, thus forming Al wiring strips 126, 127, 128 and 129. The strip 126 extends through the contact hole 125 and is connected to the p+ type source region 104. The strip 127 extends through the contact hole 125 and is connected to the n+ type source region 118. The strip 128 extends through two contact holes 125 and is connected to the p+ type drain region 105 and n+ type drain region 119. The strip 129 extends the hole 125 and is connected to the second gate electrode 123.

Figure 3I:
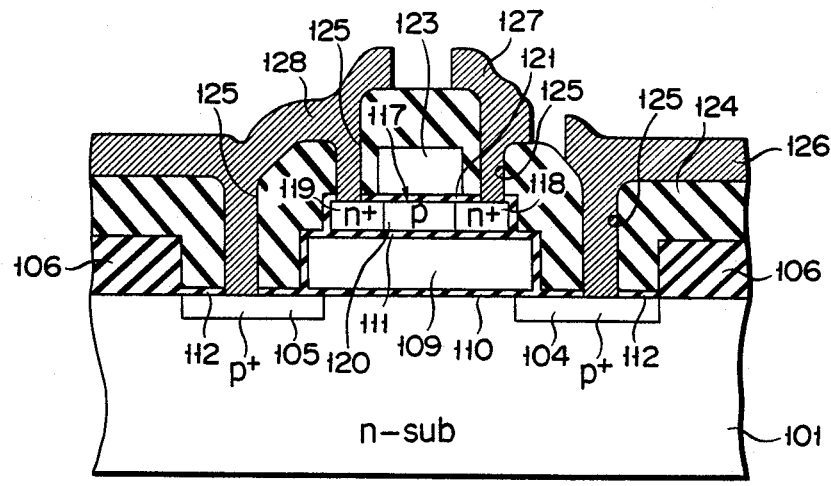
Figure 4:
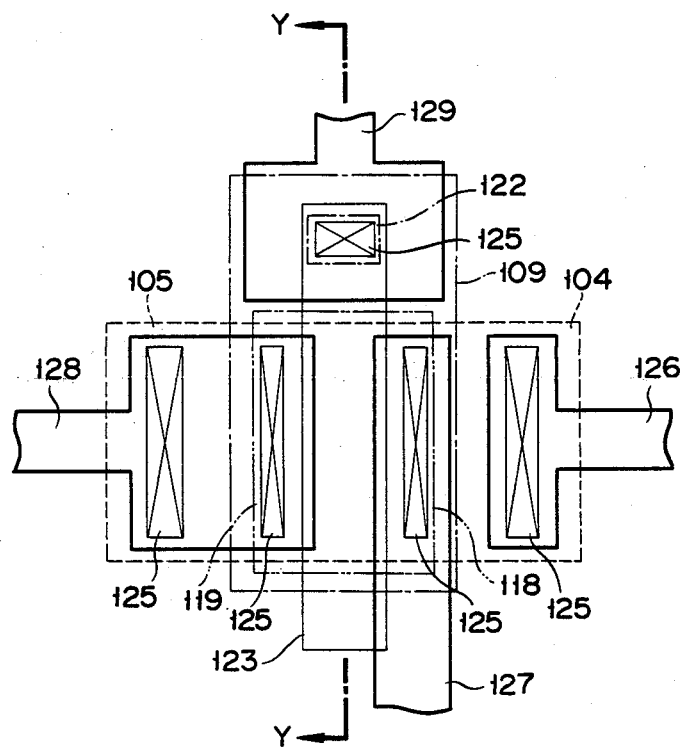
FIG. 4 is a plan view of the inverter of FIG. 3I.
Figure 5:
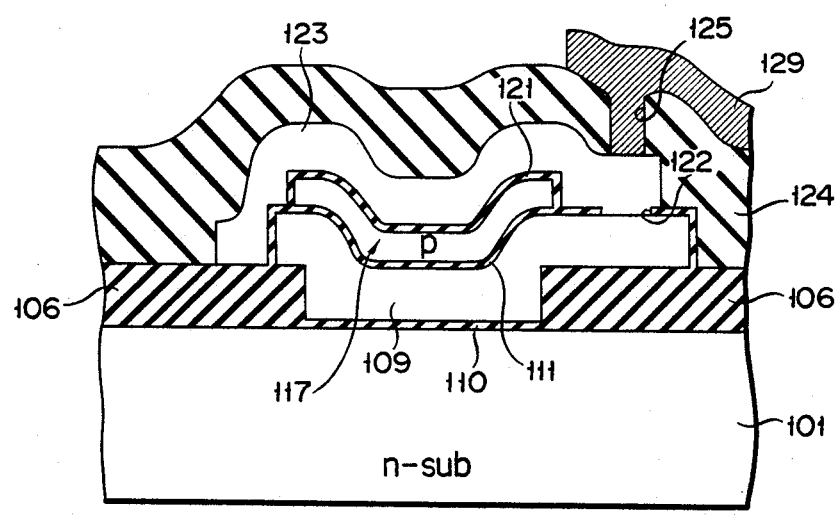
FIG. 5 is a cross sectional view taken along line Y—Y in FIG. 4.

The finished product, i.e., the 3-D-CMOS inverter, has the cross sectional view shown in FIG. 3I. FIG. 4 is a plan view and FIG. 5 is a cross sectional taken along line Y—Y in FIG. 4.

The 3-D-CMOS inverter thus manufactured will be described in more detail. As shown in FIG. 4, the field oxide film 106 is formed on the n type single crystal silicon substrate 101. It electrically isolate the island regions of the substrate 101. Each island region has the P+ type source and drain regions 104 and 105 formed in its surface region and electrically isolated from each other. The first gate oxide film 110 is formed on that portion of the island region which includes the channel region located between the regions 104 and 105. Formed on the first gate oxide film 110 is the first gate electrode 109 used for both the p-channel and the n-Channel MOS transistors. Formed on the first gate electrode 109 is the second gate oxide film 111. Further an active layer 117 of recrystallized polysilicon is formed on the second gate oxide film 111. The layer 117 consists of an n+ type source region 118, an n+ type drain region 119 and a p type channel region 120 sandwiched between the regions 118 and 119. The third gate oxide film 121 is formed on the active layer 117. The second gate electrode 123 extends through the contact hole 122 made in the second gate oxide film 111 and is connected to the first gate electrode 109. The SiO₂ film 124 with contact holes 125 covers the entire surface of the semiconductor substrate 101. The Al wiring strips 126, 127, 128 and 129 are formed on the SiO₂ film 124. The strip 126 extends through the contact hole 125 and is connected to the p+ type source region 104. The strip 127 extends through the hole 125 and is connected to the n+ type source region 118. The strip 128 extends through the two holes 125 and is connected to the p+ type drain region 105 and n+ type drain region 119. The strip 129 (not shown) extend through the hole 125 and is connected to the second gate electrode 123.

Figure 6:
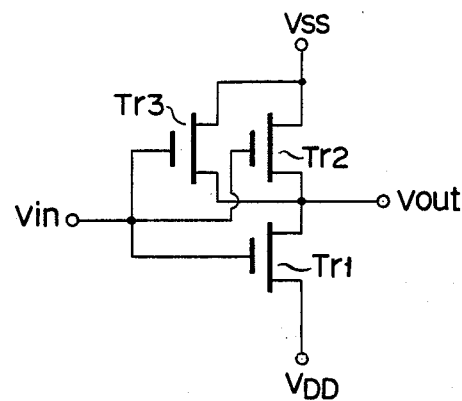
FIG. 6 shows the equivalent circuit of the CMOS inverter shown in FIGS. 3I, 4 and 5.

FIG. 6 shows the equivalent circuit of the 3-D-CMOS inverter shown in FIG. 4. This circuit comprises a p-channel MOS transistor Tr1, an n-channel MOS transistor Tr2 and an n-channel MOS transistor Tr3. The transistor Tr1 is comprised of the p+ type source and drain regions 104 and 105, first gate oxide film 110, and first gate electrode 109. The transistor Tr2 is made of the n+ type source and drain regions 118 and 119, the second gate oxide film 111, and the first gate electrode 109 used for also the MOS transistor Tr1. The transistor Tr3 is formed of the n+ type source and drain regions 118 and 119, the third gate oxide film 121 and the second gate electrode 123. The Al wiring strip 129 is connected to a terminal Vin. The Al wiring strip 126 to a terminal V$_{DD}$. The Al wiring strip 127 to a terminal V$_{SS}$. The Al wiring strip 128 to a terminal Vout. The first and second gate electrodes 109 and 123 are connected through the contact hole 122. Thus, the Tr2 and Tr3 are connected in a parallel fashion as shown in FIG. 6 since the active layer 117 (i.e., a recrystallized polysilicon layer) is interposed between the second and third gate oxide films 111 and 121. This means that the channel width of each n-channel MOS transistor has the same transconductance as an n-channel transistor whose channel width is twice as much. Therefore, the inverter can operate at a high speed.

Figure 7:
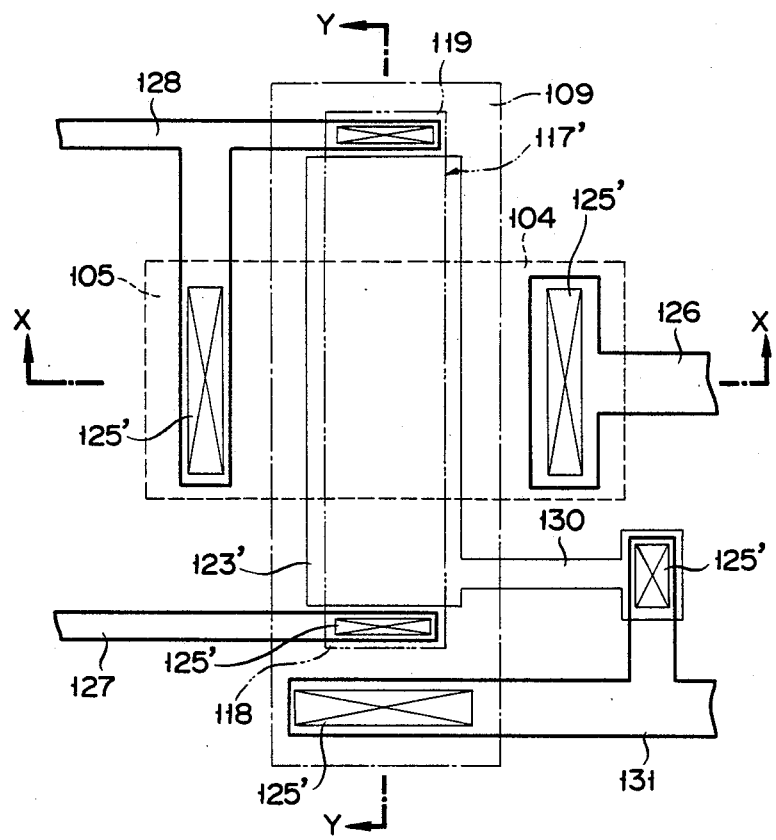
FIG. 7 is a plan view of the 3-D-CMOS inverter used in another semiconductor device according to the present invention.
Figure 8:
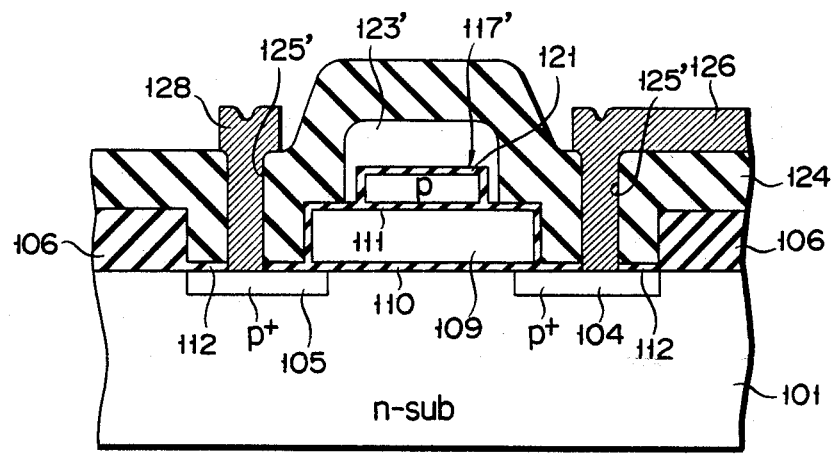
FIG. 8 is a cross sectional view taken along line X—X in FIG. 7.
Figure 9:
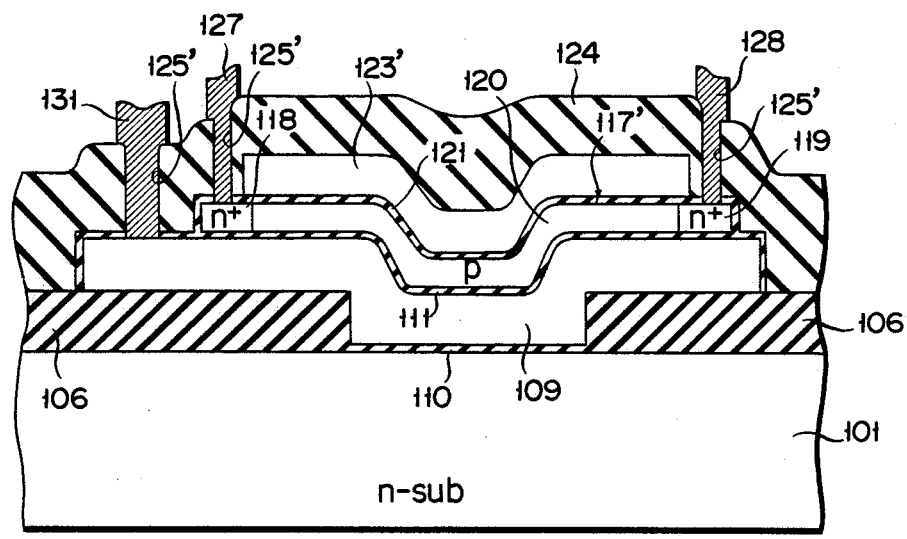
FIG. 9 is a cross sectional view taken along line Y—Y in FIG. 7.

In the above embodiment, the channel lengthwise axes of the p-channel and the n-channel MOS transistors are arranged parallel. Alternatively, they may be arranged at right angles as shown in FIGS. 7 to 9. More specifically, a field oxide film 106 is formed on an n type single silicon substrate 101. The p+ type source and drain regions 104 and 105 are formed in each of the island regions of the substrate 101' which are electrically isolated by the film 106. A first gate oxide film 110 is formed on that portion of the island region which includes a channel region formed between the regions 104 and 105. Formed on the first gate oxide film 110 is a first gate electrode 109 used for both a p-channel MOS transistor and an n-channel MOS transistor. A second gate oxide film 111 is formed on the first gate electrode 109. An active layer 117, is formed on the second gate oxide film 111. This layer 117 is made of recrystallized polysilicon and extends at right angles to the channels of the transistors. The active layer 117 consists of an n+ type source region 118, an n+ type drain region 119, and a p type channel region 120 sandwiched between the regions 118 and 119. A third gate oxide film 121 is formed on the active layer 117. A second gate electrode 123' made of phosphorous-doped polysilicon is formed on the that portion of the third gate oxide film 121 which covers the layer 117 including the channel region 120. A contact region 130 is made in the second gate electrode 123'. The entire surface of the unfinished product is covered with a SiO₂ film 124. This film 124 has contact holes 125'. Al wiring strips 126, 127, 128 and 131 are formed on the SiO₂ film 124. The strip 126 extends through the contact hole 125', and is connected to the p+ type source region 104. The strip 127 extends through the contact hole 125', and is connected to the n+ type source region 118. The strip 128 extends through the holes 125' and is connected to the p+ type drain region 105 and n+ type drain region 119. The strip 131 extends through the contact hole 125' and is connected to the first gate electrode 109 and to the contact region 130 of the second gate electrode 123'.

In this 3-D-CM0S, the p+ type source and drain regions 104 and 105, first gate oxide film 110 and first gate electrode 109 form a p-channel MCS transistor; the n+ type source and drain regions 118 and 119, second gate oxide film 111 and first gate electrode 109 form an n-channel MOS transistor; the n+ type source and drain regions 118 and 119, third gate oxide film 121 and the second gate electrode 123' form another n-channel MOS transistor. The p-channel MOS transistor has its channel arranged at right angles to those of the n-channel MOS transistors. Because of this structural feature, the channel lengthwise axis of the p-channel MOS transistor is at right angles to those of the n-channel transistors. Freedom of pattern design is thus secured.

In the 3-D-CMOS inverter of FIG. 3I, 4 and 5, the MOS transistors has their channel lengthwise axes arranged parallel. Therefore, if the channel length of the p-channel MOS transistor formed on the single crystal silicon substrate is reduced, the channel length of the n-channel MOS transistor formed on the first gate electrode is further reduced. This gives rise to short channel effect. By contrast, in the 3-D-CMOS inverter of FIGS. 7-9, the channel lengthwise axis of the p-channel MOS transistor is at right angles to those of the n-channel MOS transistors. Hence the channel lengths of the MOS transistors on the active layer side are not be reduced even if that of the MOS transistor on the substrate side is reduced. It is therefore possible to avoid such short channel effects.

As described above, this invention can provide a semiconductor device having a 3-D-CMOS inverter which can operate at a high speed without deteriorating the packing density of the semiconductor device.

What is claimed is:
1. A three-dimensional CMOS inverter, comprising:
   a semiconductor substrate of a first conductivity type;
      source and drain regions of a second conductivity type formed in said substrate and electrically isolated from each other, thereby defining a channel region between them;
   a first gate oxide film formed on that surface portion of said substrate in which at least said channel region is formed;
   a first gate electrode comprising an impurity-doped polysilicon and formed on said first gate oxide film;
   a second gate oxide film formed on said first gate electrode;
   an active layer of recrystallized polysilicon formed on said gate oxide film and comprising source and drain regions of the first conductivity type and channel region of the second conductivity type sandwiched between the source and drain regions, wherein lengthwise axis of said channel region between said source and drain regions of the second conductivity type extends at right angles to that of the channel region sandwiched between said source and drain regions of the first conductivity type;

a third gate oxide film formed on that surface portion of said active layer in which at least the channel region is formed; and a second gate electrode formed on said third gate oxide film and connected to said first gate electrode.

* * * * *